US011164684B2

(12) United States Patent
Suenaga et al.

(10) Patent No.: US 11,164,684 B2
(45) Date of Patent: Nov. 2, 2021

(54) LINEAR SHAPE MEMBER AND PRODUCING METHOD THEREFOR

(71) Applicant: Hitachi Metals, Ltd., Tokyo (JP)

(72) Inventors: Kazufumi Suenaga, Tokyo (JP); Hideyuki Sagawa, Tokyo (JP); Takahiro Sugiyama, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 22 days.

(21) Appl. No.: 16/740,102

(22) Filed: Jan. 10, 2020

(65) Prior Publication Data
US 2020/0234847 A1 Jul. 23, 2020

(30) Foreign Application Priority Data

Jan. 22, 2019 (JP) .............................. JP2019-008638

(51) Int. Cl.
*H01B 7/02* (2006.01)
*H01B 3/44* (2006.01)
*H01B 13/00* (2006.01)
*H05K 9/00* (2006.01)
*H01B 13/14* (2006.01)

(52) U.S. Cl.
CPC ........... *H01B 7/0275* (2013.01); *H01B 3/445* (2013.01); *H01B 13/0036* (2013.01); *H01B 13/148* (2013.01); *H05K 9/0098* (2013.01)

(58) Field of Classification Search
CPC .. H01B 7/0275; H01B 3/445; H01B 13/0036; H01B 13/148; H05K 9/0098

USPC ......................................................... 174/139
See application file for complete search history.

(56) References Cited

U.S. PATENT DOCUMENTS

| | | | | |
|---|---|---|---|---|
| 4,314,737 A | * | 2/1982 | Bogese | H01R 12/775 439/425 |
| 10,615,477 B2 | * | 4/2020 | Suenaga | H01P 3/06 |
| 10,770,772 B2 | * | 9/2020 | Suenaga | H01B 13/06 |
| 10,910,133 B2 | * | 2/2021 | Suenaga | C23C 18/30 |
| 2019/0013559 A1 | | 1/2019 | Suenaga et al. | |
| 2019/0013560 A1 | * | 1/2019 | Suenaga | H01P 3/06 |
| 2019/0191601 A1 | * | 6/2019 | Suenaga | H01B 11/002 |

FOREIGN PATENT DOCUMENTS

JP 6245402 B1 12/2017

* cited by examiner

*Primary Examiner* — Timothy J Thompson
*Assistant Examiner* — Michael F Mcallister
(74) *Attorney, Agent, or Firm* — McGinn IP Law Group, PLLC

(57) ABSTRACT

A linear shape member is composed of a linear shape electrical insulating body made of a fluoropolymer resin and including a plurality of crack shape grooves on a surface thereof, and a plating layer coating the surface of the electrical insulating body. The surface of the electrical insulating body meets at least either one of two conditions: that the surface of the electrical insulating body is not lower than 40 nm in arithmetic mean roughness Ra; and that the surface of the electrical insulating body is not lower than 80 nm in root mean square roughness Rms.

7 Claims, 10 Drawing Sheets

LINEAR SHAPE MEMBER AND PRODUCING METHOD THEREFOR

CROSS-REFERENCE TO RELATED APPLICATIONS

The present invention is based on Japanese Patent Application No. 2019-008638 filed on Jan. 22, 2019, the entire contents of which are incorporated herein by reference.

BACKGROUND OF THE INVENTION

1. Field of the Invention

The present invention relates to a linear shape member and a producing method therefor.

2. Description of the Related Art

Conventionally, there is known a method for producing a differential signal transmission cable provided with one pair of signal wires, an electrical insulating body layer, which is coating a periphery of the one pair of signal wires, and a plating layer, which serves as a shield to coat the electrical insulating body layer. This differential signal transmission cable producing method is designed to perform a surface roughening treatment, such as a dry ice blasting treatment or the like, on an outer peripheral surface of the electrical insulating body layer, thereafter perform a surface modification treatment such as a corona discharge exposure treatment or the like, on the outer peripheral surface of the electrical insulating body layer, and thereafter form a plating layer on the outer peripheral surface of the electrical insulating body layer (see Japanese Patent No. 6245402).

According to Japanese Patent No. 6245402, the roughening treatment allows the outer peripheral surface of the electrical insulating body layer to be not lower than 0.6 μm in arithmetic mean roughness Ra, thereby making it possible to enhance the strength of the adhesion between the plating layer and the electrical insulating body layer, and suppress the occurrence of a separation of the plating layer from the electrical insulating body layer or the occurrence of an air gap formation between the plating layer and the electrical insulating body layer.

In addition, according to Japanese Patent No. 6245402, the modification treatment allows the outer peripheral surface of the electrical insulating body layer to be including a functional group such as a carbonyl group or a hydroxy group or the like, thereby resulting in hydrophilization of the outer peripheral surface of the electrical insulating body layer, and enhancement in surface wettability.

[Patent Document 1] Japanese Patent No. 6245402

SUMMARY OF THE INVENTION

When the electrical insulating body is a fluoropolymer resin, however, the plating layer is not stably formed on the outer peripheral surface of the electrical insulating body layer even by performing the roughening treatment by the blasting treatment and the subsequent modification treatment by the corona discharge exposure treatment on the outer peripheral surface of the electrical insulating body layer as described in Japanese Patent No. 6245402, and therefore the reproducibility is low. As one of the causes of this, it is considered that the fluoropolymer resin is soft compared to a polyethylene or the like, therefore rendering the blasting treatment ineffective in the surface roughening, and the strength of the adhesion between the electrical insulating body layer and the plating layer insufficient.

Accordingly, an object of the present invention is to provide a linear shape member, which is configured to include a linear shape electrical insulating body comprising a fluoropolymer resin, and a plating layer coating a surface of that electrical insulating body, and which is designed to be high in the strength of the adhesion between the underlying electrical insulating body and the overlying plating layer, and is to provide a method for producing the same linear shape member.

For the purpose of solving the above problems, the present invention provides a linear shape member, comprising: a linear shape electrical insulating body comprising a fluoropolymer resin and including a plurality of crack shape grooves on a surface thereof; and a plating layer coating the surface of the electrical insulating body, wherein the surface of the electrical insulating body meets at least either one of two conditions: that the surface of the electrical insulating body is not lower than 40 nm in arithmetic mean roughness Ra; and that the surface of the electrical insulating body is not lower than 80 nm in root mean square roughness Rms.

Points of the invention

According to the present invention, it is possible to provide the linear shape member which is configured to include the linear shape electrical insulating body made of the fluoropolymer resin, and the plating layer coating the surface of that electrical insulating body, and which is designed to be high in the strength of the adhesion between the underlying electrical insulating body and the overlying plating layer, and it is possible to provide the method for producing the same linear shape member.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiments (Structure of a Linear Shape Member)

Figure 1:
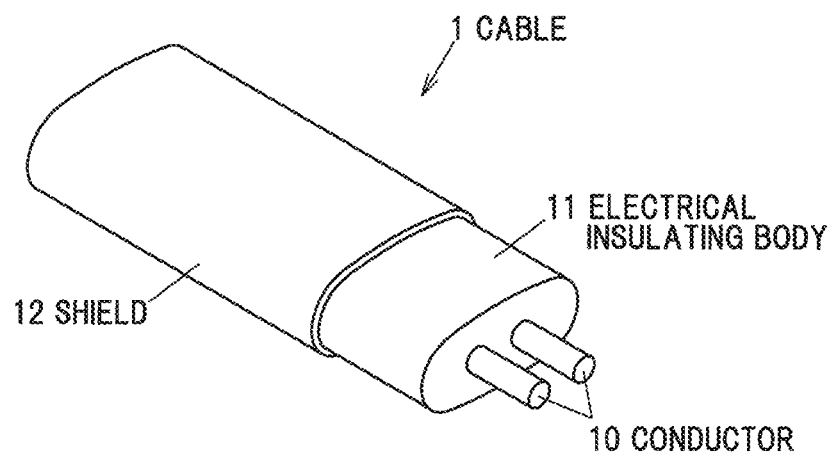
FIG. 1 is a cross-sectional view showing a cable to be used as a linear shape member according to a first embodiment.

FIG. 1 is a cross-sectional view showing a cable 1 to be used as a linear shape member according to a first embodiment. The cable 1 is configured to include two conductors 10, a linear shape electrical insulating body 11, which is being provided over a periphery of the two conductors 10, and a shield 12, which is being provided in such a manner as to directly coat a surface (an outer peripheral surface) of the electrical insulating body 11. The cable 1 is, e.g., 0.7 to 1.3 mm in diameter.

The linear shape conductors 10 constitute a core of the cable 1 and are each made of a conductor such as a copper or the like. Further, the conductors 10 may be configured as a stranded wire, which is formed by laying a plurality of conducting wires together in order to ensure a bending property. The number of the conductors 10 included in the cable 1 is not particularly limited but is appropriately determined according to a type of the cable 1. In the example shown in FIG. 1, the cable 1 is a differential signaling cable having a twinaxial structure and is configured to include the two conductors 10.

The electrical insulating body 11 may be provided over the conductors 10 with the other member not shown therebetween. In other words, the electrical insulating body 11 is provided in such a manner as to directly or indirectly coat the conductors 10.

The shield 12 is a plating layer, which is formed by performing a plating treatment on the surface of the electrical insulating body 11. The shield 12 is made of a metal such as a copper or the like. The shield 12 is, e.g., 0.5 to 30 µm in thickness.

Since the shield 12 is the plating layer, an air gap formation is less likely to occur between the overlying shield 12 and the underlying electrical insulating body 11 as compared to a conventionally generally used shield made of a metal tape wrapped around a periphery of an electrical insulating body, and so the shield 12 is able to suppress the occurrence of a degradation in the transmission properties of the cable 1 due to this air gap formation. In particular, when the cable 1 is a thin diameter cable such as a high speed transmission cable or the like, using the plating layer as the shield 12 has a profound effect because when the metal tape is used as the shield 12, the metal tape is difficult to wrap around the periphery of the electrical insulating body 11 of the cable 1 and is more likely to cause the air gap formation between the overlying shield 12 and the underlying electrical insulating body 11.

Further, since the shield 12 is the plating layer, the shield 12 is not required to be of such a thickness that a mechanical strength required for the wrapping, as in the case of the shield made of the metal tape, is produced, but the shield 12 may be of such a thickness as to be able to suppress noise in the cable 1. For example, when a noise reduction of $1/30$ to $1/1000$ required for shielding for a general electronic device is assumed (see, e.g., "Technical Description, Electromagnetic Shield", Okayama Industrial Technology Center, Technical Information, No. 457, p. 5), on the principle of the skin effect, even when the copper shield is thinned to 1 to 2 µm, a substantially desired shielding effect can be obtained in a band of several tens of GHz. This allows the thickness of the shield 12 made of the plating layer to be reduced to about $1/10$ of the thickness of the shield made of the metal tape. Note that the plating treatment for the present embodiment to be described later makes it possible to form the shield 12 having a uniform thickness of several tens of nm to several tens of µm.

For the cable 1 to be formed with the shield 12 on the surface of the electrical insulating body 11 by the plating treatment, the electrical insulating body 11 to serve as an underlying plating base is being subjected to a surface treatment under proper conditions, so as to impart the sufficient strength of the adhesion between the underlying electrical insulating body 11 and the overlying shield 12. Here, the surface treatment refers to a roughening treatment or a hydrophilizing treatment, and preferably includes both of them. Details of the surface treatment will be described later.

(Features of the Electrical Insulating Body)

The electrical insulating body 11 is made of a fluoropolymer resin. Specific examples of the fluoropolymer resin to be able to be used include a polytetrafluoroethylene (PTFE), a perfluoroalkoxy (PFA), a perfluoroethylene propene copolymer (FEP), an ethylene-tetrafluoroethylene copolymer (ETFE), a tetrafluoroethylene-perfluorodioxole copolymer (TFE/PDD), a polyvinylidene fluoride (PVDF), a polychlorotrifluoroethylene (PCTFE), an ethylene-chlorotrifluoroethylene copolymer (ECTFE), a polyvinyl fluoride (PVF), and the like.

Further, in order to reduce the dielectric constant and the dielectric loss tangent, a foamed fluoropolymer resin may be used as the material for the electrical insulating body 11. In this case, the electrical insulating body 11 can be formed by using, for example, a method, which kneads a foaming agent into a fluoropolymer resin, and controls the degree of formation of foam in that fluoropolymer resin by using the temperature or pressure during molding, a method, which injects an inert gas such as nitrogen or the like into a fluoropolymer resin at a molding pressure, and allows formation of foam in that fluoropolymer resin during pressure release, or the like.

In a transverse cross section of the cable 1, it is preferable that an outer edge of the electrical insulating body 11 is being formed in a circular shape, an elliptical shape, or a rounded corner rectangular shape (a rectangular shape with rounded corners). In this case, the plating layer is easy to form with a uniform thickness on the entire surface of the electrical insulating body 11. Moreover, the roughening treatment and the hydrophilizing treatment, which will be described later, are easy to perform uniformly on the entire surface of the electrical insulating body 11.

The surface of the electrical insulating body 11 has unevenness formed by the roughening treatment. This allows a catalyst, which is used in the plating treatment for forming the shield 12, to become resistant to desorption from the surface of the electrical insulating body 11. In addition, a plating solution, which is used in the plating treatment for forming the shield 12, is easy to pass into depressed portions of the uneven surface of the electrical insulating body 11 and is therefore easier to spread over the surface of the electrical insulating body 11. Moreover, there is an enhancement in the anchoring effect, which is produced by the shield 12 passing into the depressed portions of the uneven surface of the electrical insulating body 11. This results in an enhancement in the strength of the adhesion between the overlying shield 12 made of the plating layer and the underlying electrical insulating body 11. Furthermore, since there is an increase in the surface area of the electrical insulating body 11, there is an increase in the amounts of polar functional groups to be produced that contributes to an enhancement in the surface wettability resulting from the hydrophilizing treatment to be described later.

For the above described roughening treatment for the surface of the electrical insulating body 11, it is possible to use, e.g., an immersing treatment for the surface of the electrical insulating body 11 in a sodium naphthalene complex solution, a low temperature blasting treatment for the surface of the electrical insulating body 11, or an electron beam irradiation to the surface of the electrical insulating body 11.

When the immersing treatment for the surface of the electrical insulating body 11 in the sodium naphthalene complex solution is performed as the roughening treatment therefor, the unevenness of the surface of the electrical insulating body 11 is constituted by a plurality of crack shape grooves formed on the surface of the electrical insulating body 11. In this case, the surface of the electrical insulating body 11 is in such a state as to meet at least either one of two conditions: that the surface of the electrical insulating body 11 is not lower than 40 nm in arithmetic mean roughness Ra; and that the surface of the electrical insulating body 11 is not lower than 80 nm in root mean square roughness Rms. Configuring the surface of the electrical insulating body 11 in such a state as to meet at least either one of the above two conditions allows the strength of the adhesion between the overlying shield 12 made of the plating layer and the underlying electrical insulating body 11 to become high.

Note that, when the immersing treatment for the surface of the electrical insulating body 11 in the sodium naphthalene complex solution is performed as the roughening treatment therefor, the resulting above-mentioned values of the arithmetic mean roughness Ra and the root mean square roughness Rms of the surface of the electrical insulating body 11 necessary to achieve the high strength of the adhesion between the overlying shield 12 and the underlying electrical insulating body 11 are much smaller than the values thereof required for the other methods to be used as the roughening treatment for the surface of the electrical insulating body 11, but that, even when the arithmetic mean roughness Ra and the root mean square roughness Rms of the surface of the electrical insulating body 11 are not higher than 0.6 µm and not higher than 0.8 µm, respectively, leading to difficulty in providing the sufficient strength of the adhesion therebetween in the other methods, the sufficient strength of the adhesion therebetween is achieved with those values of the arithmetic mean roughness Ra and the root mean square roughness Rms of the surface of the electrical insulating body 11 resulting from the immersing treatment for the surface of the electrical insulating body 11 in the sodium naphthalene complex solution. This is considered to be because the widths of the crack shape grooves being formed on the surface of the electrical insulating body 11 by the immersing treatment for the surface of the electrical insulating body 11 in the sodium naphthalene complex solution are narrower than the widths of the depressed portions, which are formed thereon by the other roughening treatment methods, and therefore allow the especially significant anchoring effect to be produced between the underlying electrical insulating body 11 and the overlying shield 12.

When the immersing treatment for the surface of the electrical insulating body 11 in the sodium naphthalene complex solution is used as the roughening treatment therefor, the arithmetic mean roughness Ra and the root mean square roughness Rms of the surface of the electrical insulating body 11 can be controlled by adjusting the immersion time, the concentration or the temperature of the sodium naphthalene complex solution, or the like.

The low temperature blasting treatment for the surface of the electrical insulating body 11 is the blasting treatment that is performed in such a manner that an object (the electrical insulating body 11) to be subjected to the blasting treatment remains lowered in temperature under a low temperature condition. Since the object to be subjected to the blasting treatment can be hardened by lowering its temperature, the surface of the electrical insulating body 11 made of the soft fluoropolymer resin can effectively be roughened by the blasting treatment. In particular, the surface of the electrical insulating body 11 can more effectively be roughened by performing the blasting treatment with the temperature of the electrical insulating body 11 being lowered to the vicinity of a liquid nitrogen temperature (−196 degrees C.) by using a liquid nitrogen.

Examples of the blasting treatment to be able to be used include: a dry ice blasting using dry ice particles as a blasting medium; a sand blasting using particles of alumina, SiC or the like as the blasting medium; a wet blasting using a liquid mixture (slurry) of water and an abrasive material as the blasting medium; and the like.

In particular, the dry ice blasting is preferably used in the roughening treatment for the surface of the electrical insulating body 11. Since the dry ice sublimes under ambient pressure and does not remain on the surface of the electrical insulating body 11 after the roughening treatment, when the dry ice blasting is used as the roughening treatment for the surface of the electrical insulating body 11, there is no need for a cleaning step after the roughening treatment.

When the blasting treatment is used as the roughening treatment for the surface of the electrical insulating body 11, the arithmetic mean roughness Ra and the root mean square roughness Rms of the surface of the electrical insulating body 11 can be controlled by adjusting the particle diameter of the blasting medium to be used in the blasting treatment, the blasting pressure (spraying pressure) to be used in the blasting treatment, the distance between the blasting nozzle of the blasting device and the electrical insulating body 11, the hardness of the electrical insulating body 11, or the like.

Further, since the fluoropolymer resin constituting the electrical insulating body 11 can be engraved by electron beam irradiation, the electron beam irradiation can be used for the roughening treatment for the surface of the electrical insulating body 11 made of the fluoropolymer resin. Note that the surface roughening by the electron beam irradiation cannot be performed on a material, which is resistant to the electron beam irradiation, such as polyethylene.

When the electron beam irradiation to the surface of the electrical insulating body 11 is used as the roughening treatment therefor, the arithmetic mean roughness Ra and the root mean square roughness Rms of the surface of the electrical insulating body 11 can be controlled by adjusting the irradiation electric current density of the electron beam or the energy of the electron beam, or the like.

The arithmetic mean roughness Ra and the root mean square roughness Rms of the surface of the electrical insulating body 11 can be measured with a laser microscope or the like.

Further, it is preferable that the surface of the electrical insulating body 11 is being made high in wettability by a hydrophilizing treatment. By performing the hydrophilizing treatment on the surface of the electrical insulating body 11, it is possible to produce polar functional groups in the surface of the electrical insulating body 11, thereby resulting in an enhancement in the wettability. Here, the polar functional groups refer to the functional groups (hydrophilic groups) each having a polarity such as a carboxy group or a hydroxy group or the like. In general, the presence of the polar functional groups is directly related to the surface wettability (see, e.g., Akira Nakajima, "The Wettability of Solid Surfaces, from Superhydrophilicity to Superhydrophobicity", Kyoritsu Publishing Co., Ltd., 2014). Note that since the hydroxy group is included in the carboxy group, the hydroxy group included in the carboxy group can be said to be produced in the surface of the electrical insulating body 11 as a part of the carboxy group.

By the wettability of the surface of the electrical insulating body 11 being enhanced, a catalyst solution or the plating solution to be used in the plating treatment for the surface of the electrical insulating body 11 is easily brought into contact with the surface of the electrical insulating body 11 over the entire circumference thereof. As a result, the strength of the adhesion between the overlying shield 12 made of the plating layer and the underlying electrical insulating body 11 is enhanced, and the uniformity of the thickness of the shield 12 is also enhanced. By the strength of the adhesion between the overlying shield 12 and the underlying electrical insulating body 11 being enhanced, it is possible to suppress the occurrence of a degradation in the transmission properties of the cable 1 due to the formation of an air gap between the overlying shield 12 and the underlying electrical insulating body 11. Further, by the uniformity of the thickness of the shield 12 being enhanced, it is possible to suppress the occurrence of a degradation in the transmission properties of the cable 1, which is caused by a variation in the thickness of the shield 12.

In order to make the strength of the adhesion between the overlying shield 12 and the underlying electrical insulating body 11 sufficiently high, in an infrared total internal reflection absorption spectrum in the surface of the electrical insulating body 11 after the hydrophilizing treatment, a value obtained by normalizing (dividing) a value of an integral of an absorption peak, which is ascribed to the carboxy group, by a value of an integral of an absorption peak, which is ascribed to a C-F stretching vibration of the fluoropolymer resin, is preferably not smaller than 0.02, and more preferably not smaller than 0.03.

The infrared total internal reflection absorption spectrum can be obtained by measurement using one of Fourier transform infrared absorption spectroscopy methods, a total internal reflection absorption measurement method (ATR: Attenuated Total Reflection).

When the immersing treatment for the surface of the electrical insulating body 11 in the sodium naphthalene complex solution or the electron beam irradiation to the surface of the electrical insulating body 11 is used in the roughening treatment therefor, the polar functional groups are produced in the surface of the electrical insulating body 11. In other words, the immersing treatment for the surface of the electrical insulating body 11 in the sodium naphthalene complex solution and the electron beam irradiation to the surface of the electrical insulating body 11 serve both as the roughening treatment and as the hydrophilizing treatment for the surface of the electrical insulating body 11.

When the immersing treatment for the surface of the electrical insulating body 11 in the sodium naphthalene complex solution is performed as the surface treatment therefor, the amounts of the polar functional groups to be produced in the surface of the electrical insulating body 11 can be controlled by adjusting the immersion time, the concentration or the temperature of the sodium naphthalene complex solution, or the like. Or, when the electron beam irradiation to the surface of the electrical insulating body 11 is performed as the surface treatment therefor, the amounts of the polar functional groups to be produced in the surface of the electrical insulating body 11 can be controlled by adjusting the irradiation electric current density of the electron beam or the energy of the electron beam, or the like.

Further, in addition to the roughening treatment for the surface of the electrical insulating body 11, the surface of the electrical insulating body 11 may be subjected to, for instance, a corona discharge exposure, a plasma exposure in a gas with an atmospheric composition gas or a rare gas mixed therein, an ultraviolet irradiation, an electron beam irradiation, a γ-ray irradiation, an X-ray irradiation, an ion beam irradiation, an immersion in an ozone containing liquid, or the like as the hydrophilizing treatment for the surface of the electrical insulating body 11.

For example, when the corona discharge exposure using a device of a type that corona discharge light is radiated from a discharge probe is used in the hydrophilizing treatment for the surface of the electrical insulating body 11, the amounts of the polar functional groups to be produced in the surface of the electrical insulating body 11 can be controlled by adjusting the voltage output, the exposure time, the distance between the surface of the electrical insulating body 11 and the tip of the discharge probe, or the like.

(Cable Producing Method)

Hereinafter, one example of a method for producing the cable 1 according to the present embodiment will be described.

Figure 2:
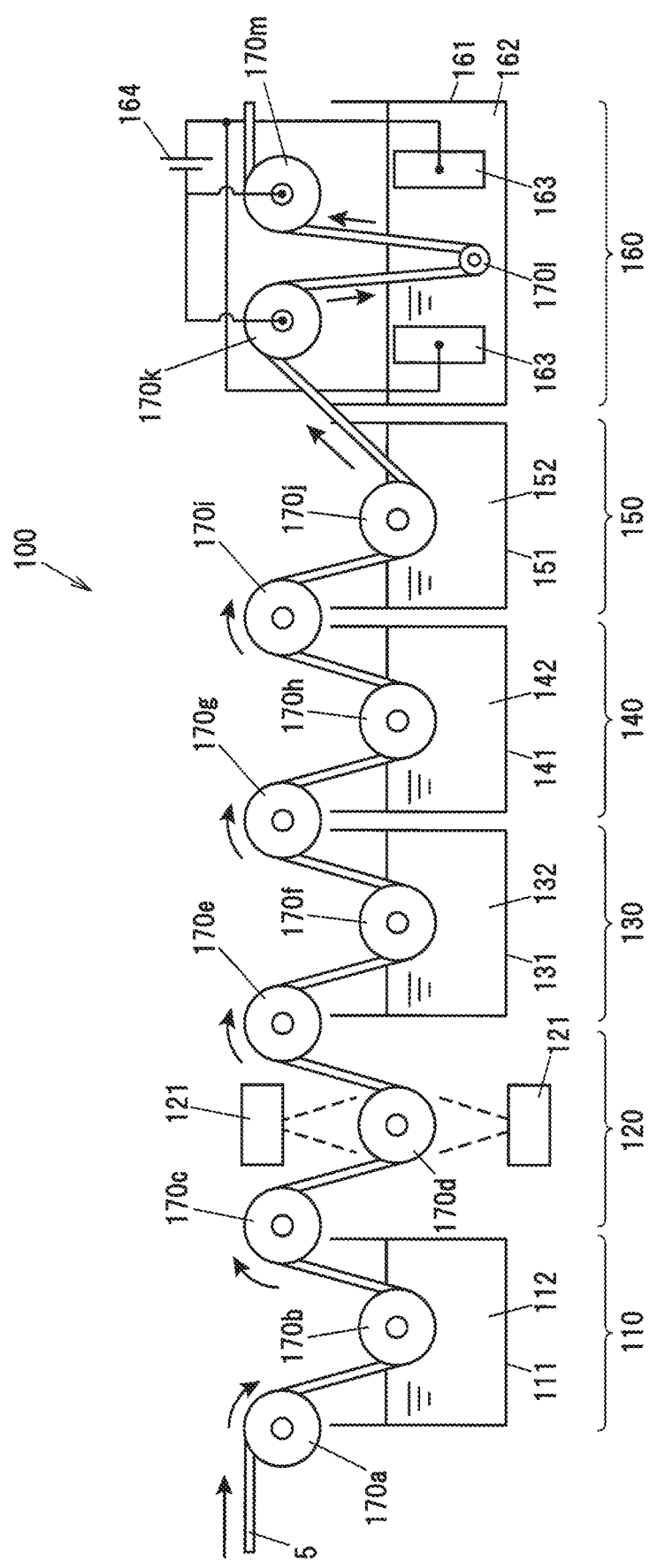
FIG. 2 is a schematic diagram showing a configuration of a shield forming system used in forming a shield that is made of a plating layer.

FIG. 2 is a schematic diagram showing a configuration of a shield forming system 100 used in forming the shield 12 that is made of the plating layer for the cable 1. The shield formation system 100 is configured to include a degreasing unit 110, a surface treatment unit 120, a first activation unit 130, a second activation unit 140, an electroless plating unit 150, an electrolytic plating unit 160, and bobbins 170a to 170m for transferring a cable 5.

In the shield forming system 100, by continuously operating the bobbins 170a to 170m at a desired rotational speed, the cable 5 is transferred at a desired speed while being maintained at a constant tension. The cable 5 before being passed through the shield forming system 100 is the cable composed of the two conductors 10 and the electrical insulating body 11 provided over the periphery of the two conductors 10, and is passed through the shield forming system 100 where the cable 5 is formed with the shield 12, thereby resulting in the cable 1. Note that the electrical insulating body 11 can be provided by, for example, known extrusion molding.

The degreasing unit 110 is designed to remove grease on the surface of the electrical insulating body 11 and is configured to include a degreasing bath 111 and a degreasing liquid 112 held by that degreasing bath 111. The degreasing liquid 112 is configured to include, for example, a sodium borate, a sodium phosphate, a surface active agent, and the like. In order for the cable 5 to be transferred to and passed through the degreasing liquid 112, at least a part of the bobbin 170b is being located in the degreasing liquid 112.

The surface treatment unit 120 is designed to perform a surface treatment on the electrical insulating body 11 and is configured to include a surface treatment device 121. Examples of the surface treatment device 121 to be used include, for performing the aforementioned roughening treatment, a blasting device, an electron beam irradiation device, an etching device using a sodium naphthalene complex solution as an etchant, and the like, and, for performing the aforementioned hydrophilizing treatment, a corona treatment device, a plasma treatment device, an ultraviolet irradiation device, an electron beam irradiation device, a $\gamma$-ray irradiation device, an X-ray irradiation device, an ion beam irradiation device, an etching device using an ozone containing liquid or the like as an etchant, and the like.

When both the roughening treatment and the hydrophilizing treatment are performed as the surface treatment for the electrical insulating body 11, or when a plurality of the roughening treatments or a plurality of the hydrophilizing treatments are performed as the surface treatment for the electrical insulating body 11, a plurality of types of the surface treatment devices 121 mentioned above may be included in the surface treatment unit 120.

The first activation unit 130 is designed to form a catalytically active layer on the surface of the electrical insulating body 11 and is configured to include a first activation bath 131, and a first activation liquid 132 held by that first activation bath 131. The first activation liquid 132 is configured to include, for example, a palladium chloride, a stannous chloride, a concentrated hydrochloric acid, and the like. The catalytically active layer is designed to form the dense high-quality plating layer as the shield 12. In order for the cable 5 to be transferred to and passed through the first activation liquid 132, at least a part of the bobbin 170f is being located in the first activation liquid 132.

The second activation unit 140 is designed to clean the surface of the catalytically active layer formed by the first activation unit 130 and is configured to include a second activation bath 141, and a second activation liquid 142 held by that second activation bath 141. The second activation liquid 142 is, for example, a sulfuric acid. In order for the cable 5 to be transferred to and passed through the second activation liquid 142, at least a part of the bobbin 170h is being located in the second activation liquid 142.

The electroless plating unit 150 is designed to form an electroless plating layer before an electrolytic plating treatment, and make the surface of the electrical insulating body 11 (the surface of the catalytically active layer) electrically conductive, and is configured to include an electroless plating bath 151, and an electroless plating solution 152 held by that electroless plating bath 151. The electroless plating solution 152 is configured to include, for example, a copper sulfate, a Rochelle salt, a formaldehyde, a sodium hydroxide and the like. In order for the cable 5 to be transferred to and passed through the electroless plating solution 152, at least a part of the bobbin 170j is being located in the electroless plating solution 152.

The electrolytic plating unit 160 is designed to perform an electrolytic plating treatment and is configured to include an electrolytic plating bath 161, an electrolytic plating solution 162 held by that electrolytic plating bath 161, one pair of anodes 163, and a power supply unit 164.

As examples of compositions of the electrolytic plating solutions 162, a composition of a copper sulfate ($CuSO_4$) plating solution and a composition of a copper cyanide (CuCN) plating solution, and producing methods therefor are shown below.

[Copper Sulfate Plating Solution]

An example of the composition of the copper sulfate plating solution for the electrolytic plating solution 162 is shown in Table 1. The plating solution composition components, "sodium chloride, hydrochloric acid" shown in Table 1 are examples of chlorides.

TABLE 1

| Plating solution composition | Chemical formula | Concentration (g/l) |
| --- | --- | --- |
| Copper sulfate | $CuSO_4 \cdot 5H_2O$ | 60-250 |
| Copper metal | Cu | 15-70 |
| Sulfuric acid | $H_2SO_4$ | 25-220 |
| Chlorine ion (sodium chloride, hydrochloric acid) | Cl— (NaCl, HCl) | 0.02-0.2 |

First, about 60 to 70% water by volume of the entire plating solution is put into the sufficiently cleaned electrolytic plating bath 161, and thereafter the water temperature thereof is elevated from room temperature to around 50 degrees C. Next, an amount of a copper sulfate corresponding to a required plating deposition amount depending on the desired thickness of the shield 12, the size or length of the cable 5, and the like is put into the above-mentioned heated water, which is agitated until the completion of the dissolution of that copper sulfate. Then, in order to control the electrical conductivity (electric current density) of the plating solution and the solubility of the anode copper plate to their respective proper ranges, a required amount of a sulfuric acid is added to the plating solution while being agitated, and thereafter, water is additionally put into the plating solution until the amount of the plating solution reaches the finally required plating solution amount. Further, in order to remove impurities in the plating solution, an activated carbon is put into the plating solution or an activated carbon layer is provided on a filtering medium of a filtering machine, and thereafter the plating solution is circulated through the filtering machine and the activated carbon with the impurities adsorbed thereon is removed.

Next, in order to match the concentration of chlorine ions, which enhance the action of a surface gloss of the plating layer, to a predetermined value, a sodium chloride or a hydrochloric acid or the like is appropriately added to the plating solution. Then, it is analyzed and checked whether the sulfuric acid and the copper sulfate are at their respective specified concentrations. Next, after properly adding an additive agent such as a gloss agent or a surface active agent or the like being compatible to the material for the electrical insulating body 11, the Hull cell test (see, e.g., Shikio Yamana, "Mechanical Engineering Introductory Series, Introduction to Plating Work", Rikogakusha Publishing Co., Ltd. or Hidehiko Enomoto, Naoji Furukawa, Soujun Matsumura, "Composite Plating", Nikkan Kogyo Shimbun, Ltd.) is performed to check a state of the plating solution as to whether the desired plating layer can be produced or not. Finally, after performing an electrolytic purification at on the order of 10 A/dm² or so for several hours while performing a continuous filtration, it is checked whether or not the plating film can stably be formed.

When the copper sulfate plating solution is used as the electrolytic plating solution 162 to form a Cu atom (metal) from a Cu ion, a reaction represented by chemical equation 1 below occurs. Chemical equation 1 represents that a divalent Cu cation gains two electrons to become a Cu atom (metal).

[Equation 1]

$$Cu^{2+}+2e^- \to Cu \tag{Eq. 1}$$

In the reaction represented by chemical equation 1, since two electrons become necessary for one Cu ion, the amount of electric charges necessary to produce 1 mol of Cu is about 192,971 C which is two times the product of the elementary electric charge and the Avogadro constant. For this reason, in light of the atomic mass of copper being 63.54, the amount of electric charges necessary to form 1 g of copper is about 3,037 C/g.

[Copper Cyanide Plating Solution]

An example of the composition of the copper cyanide plating solution for the electrolytic plating solution 162 is shown in Table 2. The plating solution composition components, "free sodium cyanide (free potassium cyanide)" shown in Table 2 are alkali cyanides remaining in the electrolytic plating bath 161 without reacting with a copper cyanide.

TABLE 2

| Plating solution composition | Chemical formula | Concentration (g/l) |
|---|---|---|
| Cuprous cyanide | CuCN | 20-80 |
| Sodium cyanide (potassium cyanide) | NaCN (KCN) | 25-130 |
| Free sodium cyanide (free potassium cyanide) | NaCN (KCN) | 5-25 |
| Potassium sodium tartrate | KNaC₄H₄O₆·4H₂O | 15-60 |
| Sodium carbonate (potassium carbonate) | Na₂CO₃ (K₂CO₃) | 10-30 |
| Potassium hydroxide (sodium hydroxide) | KOH (NaOH) | 10-20 |

First, about 60% pure water by volume of the entire plating solution, with impurities such as sulfur or chlorine or the like removed therefrom, is put into another bath. Next, a sodium cyanide or a potassium cyanide is added to the pure water and dissolved therein to form an alkali cyanide aqueous solution. Further, a cuprous cyanide made into a paste by using the pure water is added to the alkali cyanide aqueous solution, which is agitated and dissolved therein. Further, for the purpose of suppressing the occurrence of a cyan decomposition, a potassium hydroxide or a sodium hydroxide is added to the plating solution to adjust the pH of the plating solution or the electrical conductivity of the plating solution. Next, with the plating solution being heated to from 40 to 70 degrees C., which is close to the temperature of the plating solution during the plating treatment, an activated carbon or the like is added thereto and sufficiently agitated, and is thereafter allowed to stand to allow the activated carbon with impurities adsorbed thereon to settle out. Thereafter, the plating solution is passed through a filtering device to remove the activated carbon or the like with the impurities captured by them, and is then poured into the electrolytic plating bath 161, followed by adding pure water thereto to adjust the amount of the plating solution, resulting in the copper cyanide plating solution.

Next, this resulting copper cyanide plating solution is analyzed, and if desired, an additive agent is added thereto to ensure an enhancement and a stabilization in plating performance Specifically, a proper amount of a sodium carbonate or a potassium carbonate is added thereto as a pH buffer or adjuster. Further, a potassium sodium tartrate (a Rochelle salt) is added thereto to smoothly dissolve the copper anode and efficiently provide copper ions. Finally, a stainless steel plate is hung as a cathode while a rolled copper plate to be used for plating is hung as an anode, and a weak electrolysis is performed with a weak current density (0.2 to 0.5 A/dm²).

When the copper cyanide plating solution is used as the electrolytic plating solution 162 to form a Cu atom (metal) from a Cu ion, a reaction represented by chemical equation 2 below occurs. Chemical equation 2 represents that a monovalent Cu cation gains a single electron to become a Cu atom (metal).

[Equation 2]

$$Cu^{+}+e^- \to Cu \tag{Eq. 2}$$

In the reaction represented by chemical equation 2, since one electron becomes necessary for one Cu ion, the amount of electric charges necessary to produce 1 mol of Cu is approximately 96,485 C (corresponding to the Faraday constant) which is the product of the elementary electric charge and the Avogadro constant. For this reason, in light of the atomic mass of copper being 63.54, the amount of electric charges necessary to form 1 g of copper is about 1,518 C/g.

As shown by chemical equation 3 below, the current i is expressed in terms of the amount of electric charges Q and the time t. For this reason, if the electrolytic platings are the same in electric current density, in principle, when using the copper cyanide plating solution including the low valence (valence+1) copper ions as the electrolytic plating solution 162, it is possible to form the shield 12 made of the plating layer in half the time taken when using the copper sulfate plating solution. For that reason, if the use voltage and electric current during the electrolytic plating are constant, the power consumption, which is directly related to the plating time, is considered to become half, and the energy cost can therefore be lowered. In addition, since the factory operation time in the electrolytic plating treatment step becomes half, a substantial reduction in labor cost for number produced can be expected.

[Equation 3]

$$i=dQ/dt \tag{Eq. 3}$$

Note that the plating solution to be able to be used as the electrolytic plating solution 162 is not limited to the copper sulfate plating solution or copper cyanide plating solution as described above, but may be, for example, a copper fluoroborate plating solution, which is produced by mixing Cu(BF₄)₂, HBF₄, a Cu metal and the like together, or a copper pyrophosphate plating solution, which is produced by mixing Cu₂P₂O₇·3H₂O, K₄P₂O₇·3H₂O, NH₄OH, KNO₃, a Cu metal, and the like together. Further, the plating solution to be able to be used as the electrolytic plating solution 162 may be a plating solution, which is produced by combining together 2 or more types of plating solutions of the above mentioned plating solutions.

The one pair of anodes 163 are being immersed in the electrolytic plating solution 162. The one pair of anodes 163 act as a provider of the copper ions in electrolytic plating and are the ones each produced by casting and rolling a molten copper (a crude copper having a purity of about 99%) produced from a copper melt, for example. Alternatively, a stripped off copper plate (electrolytic copper) may be used as the one pair of anodes 163, which is made of a copper with an enhanced purity produced by performing a starting sheet electrolysis with the crude copper to be used as an anode and a stainless steel or titanium plate or the like to be used as a cathode, and stripping off the copper deposited on the cathode surface.

The bobbin 170$k$ and the bobbin 170$m$ located over the electrolytic plating bath 161 are electrically conductive and function as the cathodes. The bobbin 170$l$ located in the electrolytic plating solution 162 is electrically insulative. The power supply unit 164 applies a DC voltage to between the anodes 163 and the bobbins 170$k$ and 170$m$ which act as the cathode bobbins.

With the DC voltage being applied to between the anodes 163 and the bobbin 170$k$ and the bobbin 170$m$, the cable 5 is transferred to and passed through the electrolytic plating solution 162, to thereby form the electrolytic plating layer on the electroless plating layer on the surface of the electrical insulating body 11, resulting in the shield 12.

Note that the transfer mechanism of the cable 5 in the electrolytic plating unit 160 is not limited to the one using the bobbin 170$k$, the bobbin 170$l$, and the bobbin 170$m$. For example, the transfer mechanism of the cable 5 in the electrolytic plating unit 160 may be a mechanism as to, instead of providing the bobbin mechanism in the electrolytic plating solution 162, transfer the cable 5 by bending the cable 5 into a shape having a predetermined curvature or a large number of curvatures, and passing the bent cable 5 through the electrolytic plating solution 162 in such a manner as to press out the bent cable 5 from one side, while pulling the bent cable 5 from the other side. Furthermore, without providing the transfer mechanism, the electrolytic plating may be performed by immersing the bundled cable 5 in the electrolytic plating solution 162, and then connecting the bundled cable 5 to a cathode electrode, and properly rocking the bundled cable 5 to thereby bring the entire surface of the bundled cable 5 into contact with the electrolytic plating solution 162.

Next, one example of a process flow for forming the shield 12 using the shield forming system 100 will be described.

First, the cable 5 composed of the two conductors 10 and the electrical insulating body 11 provided over the periphery of the two conductors 10 is immersed in the degreasing liquid 112 in the degreasing unit 110 for 3 to 5 minutes. The temperature of the degreasing liquid 112 at this point of time is from 40 to 60 degrees C., for example. This results in removal of the grease adhering to the surface of the electrical insulating body 11 of the cable 5.

Note that, in the subsequent surface treatment step for the electrical insulating body 11 of the cable 5, when performing the treatment on the surface of the electrical insulating body 11 of the cable 5, such as the roughening treatment by the blasting method or the like, which has the effect of removing the grease and the like adhering to the surface of the electrical insulating body 11 of the cable 5, it is possible to omit the degreasing step in the degreasing unit 110.

Next, in the surface treatment unit 120, the cable 5 is subjected to the immersing treatment in the sodium naphthalene complex solution, which serves both as the roughening treatment and as the hydrophilizing treatment, for the surface treatment for the electrical insulating body 11 of the cable 5.

In the immersing treatment for the cable 5 in the sodium naphthalene complex solution, the immersion time is set at 5 to 60 seconds, and the treatment temperature is set at about 20 to 30 degrees C. (room temperature). After the immersing treatment for the cable 5, in order to prevent a plating adhesion failure or a plating peeling off, the residue of the sodium naphthalene complex solution having been scattered over the surface of the electrical insulating body 11 of the cable 5 having been subjected to the immersing treatment is sufficiently removed by an ultrasonic cleaning or a swing cleaning using an organic solvent such as acetone or alcohols or the like.

Next, in the first activation unit 130, the cable 5 is immersed in the first activation liquid 132 for 1 to 3 minutes. The temperature of the first activation liquid 132 is, for example, from 30 to 40 degrees C. This results in formation of a catalytically active layer on the surface of the electrical insulating body 11. Specifically, for example, by using a colloidal solution of Pd—Sn particles as the first activation liquid 132, the Pd—Sn particles containing Pd exhibiting a high catalytic activity are attached to the surface of the electrical insulating body 11, resulting in the formation of the catalytically active layer on the surface of the electrical insulating body 11.

Next, in the second activation unit 140, the cable 5 is immersed in the second activation liquid 142 for 3 to 6 minutes. The temperature of the second activation liquid 142 is, for example, from 30 to 50 degrees C. This makes it possible to, for example, remove Sn, which lowers the degree of activity, from the catalytically active layer on the surface of the electrical insulating body 11, and thereby increase the degree of activity of the catalytically active layer.

Next, in the electroless plating unit 150, the cable 5 is immersed in the electroless plating solution 152 for a period of time of not more than 10 minutes. The temperature of the electroless plating solution 152 is from 20 to 30 degrees C., for example. This results in formation of an electroless plating layer as a seed layer for electrolytic plating on the surface of the electrical insulating body 11, making the surface of the electrical insulating body 11 electrically conductive. The longer the immersion time in the electroless plating solution 152, the greater the thickness of the electroless plating layer.

Next, in the electrolytic plating unit 160, the cable 5 is immersed in the electrolytic plating solution 162 for a period of time of not more than 3 minutes. The thickness of the resulting electrolytic plating layer can be controlled by the transfer speed for the cable 5 or the immersion time for the cable 5 in the electrolytic plating solution 162. The transfer speed for the cable 5 or the immersion time for the cable 5 is optimized in light of the electric current density, the concentration of the electrolytic plating solution 162 in the electrolytic plating bath 161, the pH of the electrolytic plating solution 162 in the electrolytic plating bath 161, the temperature of the electrolytic plating solution 162 in the electrolytic plating bath 161, the types of the additive agents, and the like, according to the shielding performance of the shield 12, the management status for the electrolytic plating solution 162 in the electrolytic plating bath 161, the change over time of the electrolytic plating solution 162 in the electrolytic plating bath 161, and the like.

Examples of the specific conditions for the electrolytic plating in the electrolytic plating unit 160 are shown in Table 3 below. The "bath temperature" and the "bath voltage" shown in Table 3 are the temperature of the electrolytic plating solution 162 in the electrolytic plating bath 161, and the voltage applied to between the anodes 163 in the electrolytic plating bath 161, and the bobbin 170*k* and the bobbin 170*m*, which act as the cathodes, respectively.

TABLE 3

| Items | Conditions |
|---|---|
| Bath temperature (° C.) | 20-30 |
| Cathode current density (A/dm$^2$) | 1-6 |
| Anode current density (A/dm$^2$) | −2.5 |
| Bath voltage (V) | 1-6 |
| Agitation method | Air agitation |
| Filtration | Continuous filtration, 3 times/hour or more |
| Anode | Phosphorus containing copper |
| Anode bag | Saran cloth, or the like |

The above-described electrolytic plating results in the formation of the electrolytic plating layer on the surface of the electroless plating layer. The shield 12 is configured as a layered member with the electroless plating layer and the electrolytic plating layer being layered therein. By, in turn, performing the above-described steps of the method for producing the cable 1, the cable 1 according to the present embodiment is produced.

Note that, although not shown in FIG. 2, it is preferable to perform a cleaning (an ultrasonic cleaning, a swing cleaning, a running water cleaning or the like) of the cable 5 with pure water before performing the subsequent steps described above so that no failure is caused by the remaining chemical agents used in the previous steps.

Also, in order to achieve the transfer speeds of the cable 5 which are each suitable for each of the above-described treatments to be performed in the steps, respectively, of the method for producing the cable 1, it is preferable that, for each of the bobbins 170*a* to 170*m*, the respective number of rotations is optimized by adjusting the respective gear ratio (the respective rotation radius). For that reason, it is preferable that a respective rotation mechanism with a respective buffer is installed between adjacent ones of the units 110, 120, 130, 140, 150, and 160, so as to be able to optionally perform a transfer speed alteration or a temporary standby operation in the production lines between the production steps described above.

Advantageous Effects of the Embodiment

In the cable 1 according to the above embodiment, since the roughening treatment, which is effective for the fluoropolymer resin, is performed as the surface treatment for the electrical insulating body 11, it is possible to enhance the strength of the adhesion between the underlying electrical insulating body 11 made of the fluoropolymer resin and the overlying shield 12 made of the plating layer, and it is possible to suppress the occurrence of a peeling of the plating layer (the shield 12) from the electrical insulating body 11, or the occurrence of a degradation in the transmission properties of the cable 1 due to the formation of an air gap between the plating layer (the shield 12) and the electrical insulating body 11.

Note that the method for enhancing the strength of the adhesion between the electrical insulating body 11 made of the fluoropolymer resin and the plating layer (the shield 12) in the above embodiment can be applied to a general linear shape member of a cable, a tube, an electrically conductive fiber, and the like, having a linear shape electrical insulating body formed with a plating layer thereon.

Figure 3:
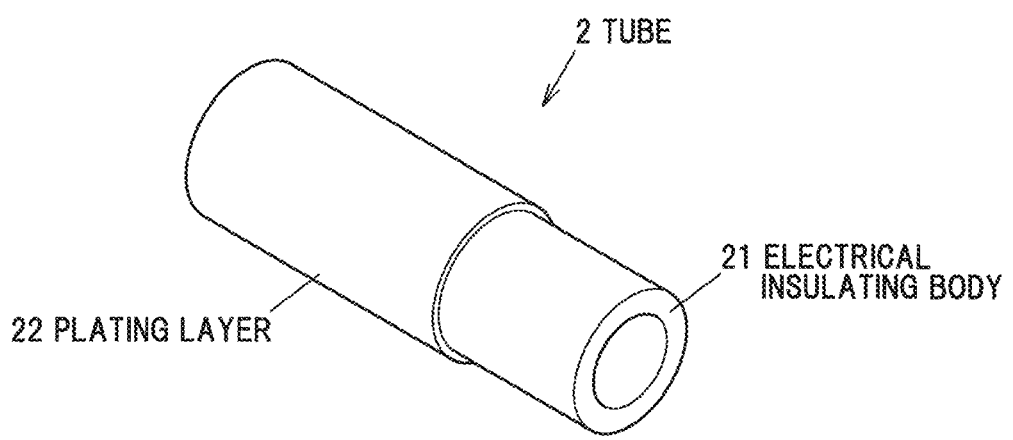
FIG. 3 is a perspective view showing a tube according to a modification to the present invention.

FIG. 3 is a perspective view showing a tube 2 according to a modification to the present invention. The tube 2 is configured to include a hollow linear shape electrical insulating body 21, and a plating layer 22 that is provided in such a manner as to directly coat a surface (an outer peripheral surface) of the electrical insulating body 21. As with the electrical insulating body 11 of the cable 1, the electrical insulating body 21 of the tube 2 is made of a fluoropolymer resin, and the conditions to be met by the surface state of the electrical insulating body 21, such as the arithmetic mean roughness Ra of the electrical insulating body 21, or in an infrared total internal reflection absorption spectrum in the surface of the electrical insulating body 21 after the hydrophilizing treatment, a value obtained by normalizing (dividing) a value of an integral of an absorption peak, which is ascribed to the carboxy group, by a value of an integral of an absorption peak, which is ascribed to a C—F stretching vibration of the fluoropolymer resin, or the like, are also the same as those of the electrical insulating body 11 of the cable 1. The constituent plating layer 22 of the tube 2 can be formed from the same materials as those of the shield 12 of the cable 1 by the same method. The tube 2 can be used as, for example, a waveguide or the like.

Figure 4A:
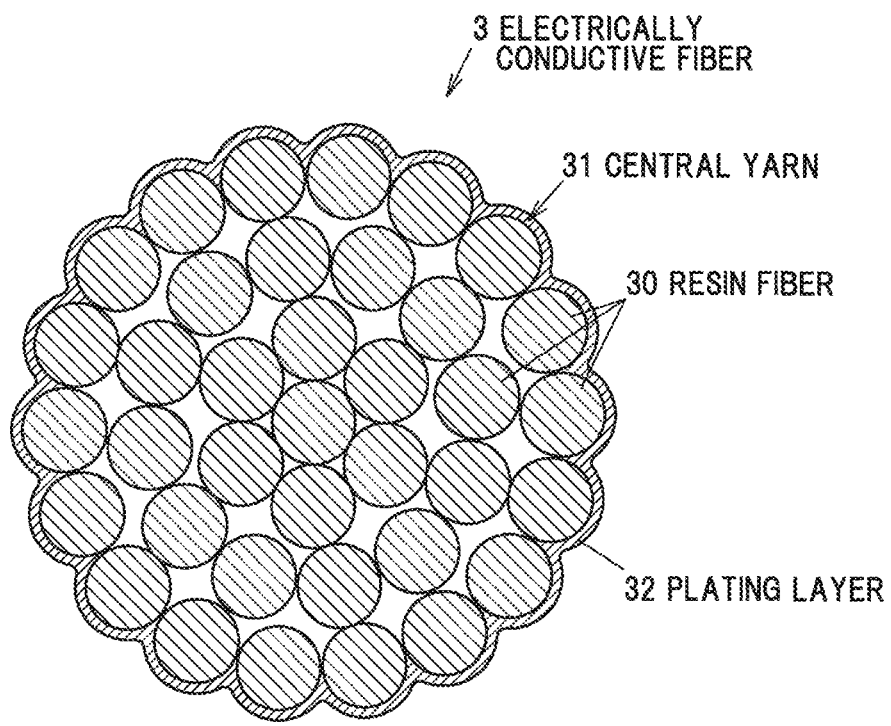
FIGS. 4A and 4B are transverse cross-sectional views showing electrically conductive fibers according to modifications, respectively, to the present invention.
Figure 4B:
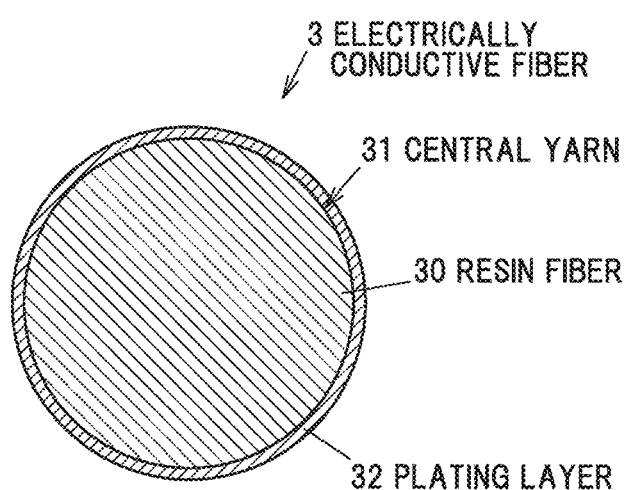

FIGS. 4A and 4B are transverse cross-sectional views showing electrically conductive fibers 3 according to modifications, respectively, to the present invention. The electrically conductive fibers 3 are each being configured to include a central yarn 31, which is made of one resin fiber 30 (see FIG. 4B), or which is composed of a plurality of resin fibers 30 (see FIG. 4A) laid together, and a plating layer 32 that is provided in such a manner as to directly coat a surface (an outer peripheral surface) of the central yarn 31. FIG. 4A shows a cross section of the electrically conductive fiber 3 when the constituent central yarn 31 of the electrically conductive fiber 3 is composed of a plurality of resin fibers 30 laid together, and FIG. 4B shows a cross section of the electrically conductive fiber 3 when the constituent central yarn 31 of the electrically conductive fiber 3 is made of one resin fiber 30.

As with the electrical insulating body 11 of the cable 1, the resin fibers 30 of the electrically conductive fibers 3 are each made of a fluoropolymer resin, and the conditions to be met by the surface state of the resin fibers 30, such as the arithmetic mean roughness Ra of the resin fibers 30, or in an infrared total internal reflection absorption spectrum in the surface of the resin fibers 30 after the hydrophilizing treatment, a value obtained by normalizing (dividing) a value of an integral of an absorption peak, which is ascribed to the carboxy group, by a value of an integral of an absorption peak, which is ascribed to a C—F stretching vibration of the fluoropolymer resin, or the like, are also the same as those of the electrical insulating body 11 of the cable 1. The constituent plating layers 32 of the electrically conductive fibers 3 can be formed from the same materials as those of the shield 12 of the cable 1 by the same method.

The electrically conductive fibers 3 can be used as, for example, a braided shield used in various cables such as an xEV vehicle harness, a robot harness, an electromagnetic shield wire for a medical probe, a lightweight earphone cord, a lightweight heater electrical conducting wire, a high speed transmission cable and the like. That is, according to the present invention, it is possible to provide a cable provided with a braided shield composed of a plurality of the electrically conductive fibers 3 braided together.

In this case, the braided shield is formed by braiding the plurality of the electrically conductive fibers 3 together. Since the braided shield composed of the plurality of the electrically conductive fibers 3 is greatly light in weight compared to a braided shield made entirely of a metal, it is possible to make a cable or the like equipped with this braided shield composed of the plurality of the electrically conductive fibers 3 light in weight. In addition, for example, by using the braided shield composed of the plurality of the electrically conductive fibers 3, it is possible to reduce the total weight of an xEV vehicle or a robot, and it is therefore possible to save their electric power.

Further, the electrically conductive fibers 3 can be used as a filter to be used in a water filter device or the like. In this case, a filter is formed by braiding a plurality of the electrically conductive fibers 3 together. That is, according to the present invention, it is possible to provide a filter composed of a plurality of the electrically conductive fibers 3 braided together. Further, in this case, the constituent plating layers 32 of the electrically conductive fibers 3 are preferably made of a Ag or a Cu having a bactericidal action. The filter made of a plurality of the electrically conductive fibers 3 is greatly light in weight compared to a filter made entirely of a metal

EXAMPLE 1

First, perfluoroethylene propene copolymers (FEPs) used as sheet-like fluoropolymer resins were subjected to an immersing treatment in a sodium naphthalene complex solution, a low temperature blasting treatment, or an electron beam irradiation, and the states of their surfaces were investigated.

Figure 5A:
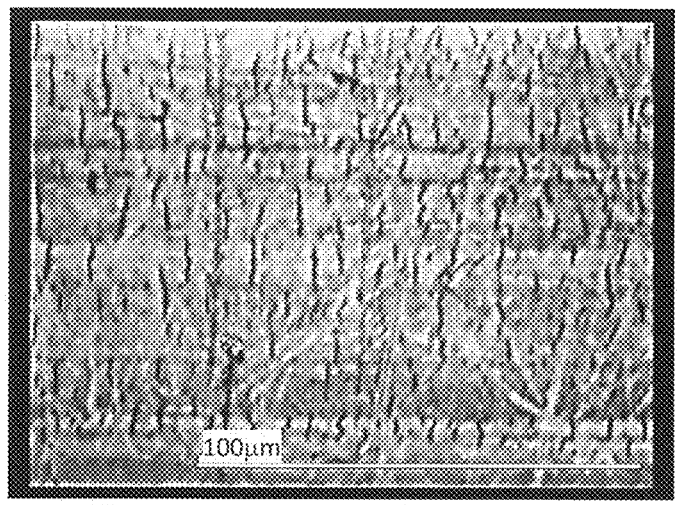
FIGS. 5A, 5B and 5C are images observed with a laser microscope, showing surfaces of fluoropolymer resins subjected to an immersing treatment in a sodium naphthalene complex solution, a low temperature blasting treatment, and an electron beam irradiation, respectively, which were performed as a roughening treatment.
Figure 5B:
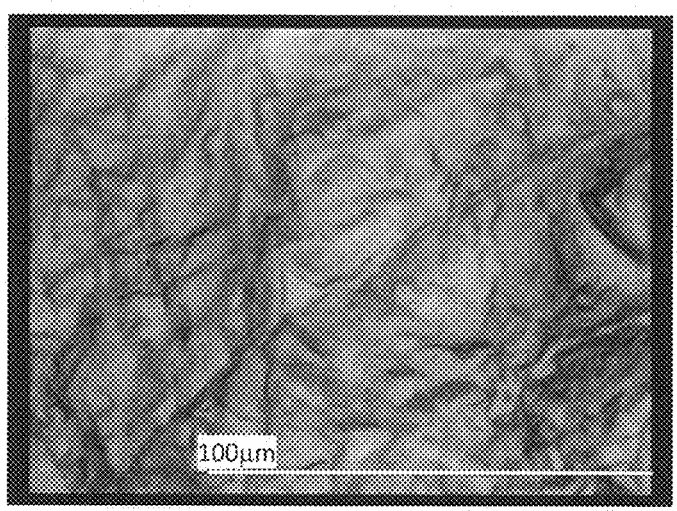
Figure 5C:
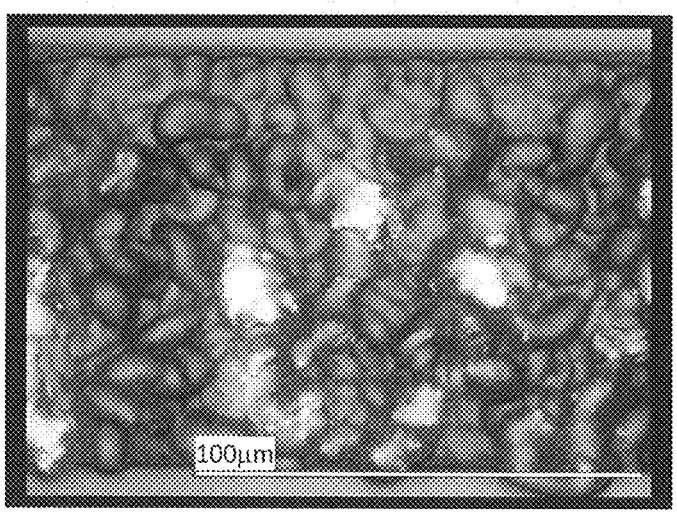

FIG. 5A, FIG. 5B, and FIG. 5C are images which were produced by laser microscope observation of the surfaces of the fluoropolymer resins that were subjected to the immersing treatment in the sodium naphthalene complex solution, the low temperature blasting treatment, and the electron beam irradiation, respectively.

According to FIG. 5A, FIG. 5B, and FIG. 5C, the surfaces of the fluoropolymer resins that were subjected to the low temperature blasting treatment or the electron beam irradiation had no flatness, whereas the surface of the fluoropolymer resin that was subjected to the immersing treatment in the sodium naphthalene complex solution was formed with crack shape grooves, while remaining maintained at a certain degree of flatness.

Next, the electrical insulating body 21 of the tube 2 according to the above embodiment was prepared, and the relationships between the roughening treatment time and the arithmetic mean roughness Ra or the root mean square roughness Rms of the electrical insulating body 21 were investigated. As a material for the electrical insulating body 21, a polytetrafluoroethylene (PTFE) which was a fluoropolymer resin was used. The arithmetic mean roughness Ra and the root mean square roughness Rms of the electrical insulating body 21 were measured along the length direction of the tube 2.

Figure 6A:
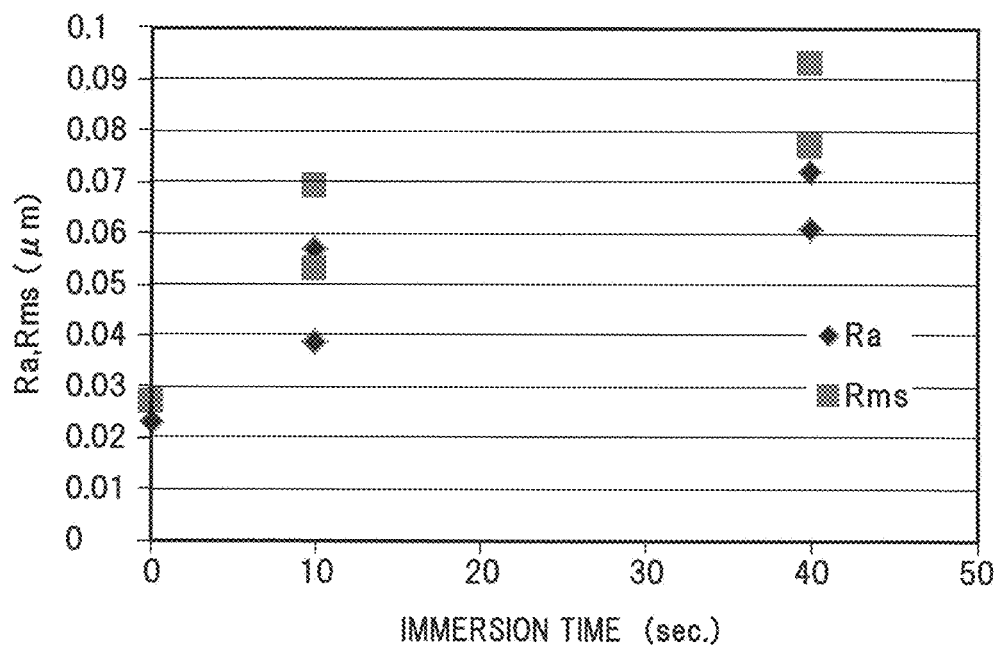
FIG. 6A is a graph showing the relationships between the immersion time and the arithmetic mean roughness Ra or the root mean square roughness Rms, when an electrical insulating body was subjected to the immersing treatment in the sodium naphthalene complex solution, which was performed as the roughening treatment.

FIG. 6A is a graph showing the relationships between the immersion time and the arithmetic mean roughness Ra or the root mean square roughness Rms, when the electrical insulating body 21 was subjected to the immersing treatment in the sodium naphthalene complex solution, which was performed as the roughening treatment.

According to FIG. 6A, it was seen that the arithmetic mean roughness Ra and the root mean square roughness Rms of the electrical insulating body 21 of the tube 2 were able to be controlled by adjusting the immersion time, and that the arithmetic mean roughness Ra of the electrical insulating body 21 was able to be not lower than 40 nm, while the root mean square roughness Rms of the electrical insulating body 21 was able to be not lower than 80 nm.

Figure 6B:
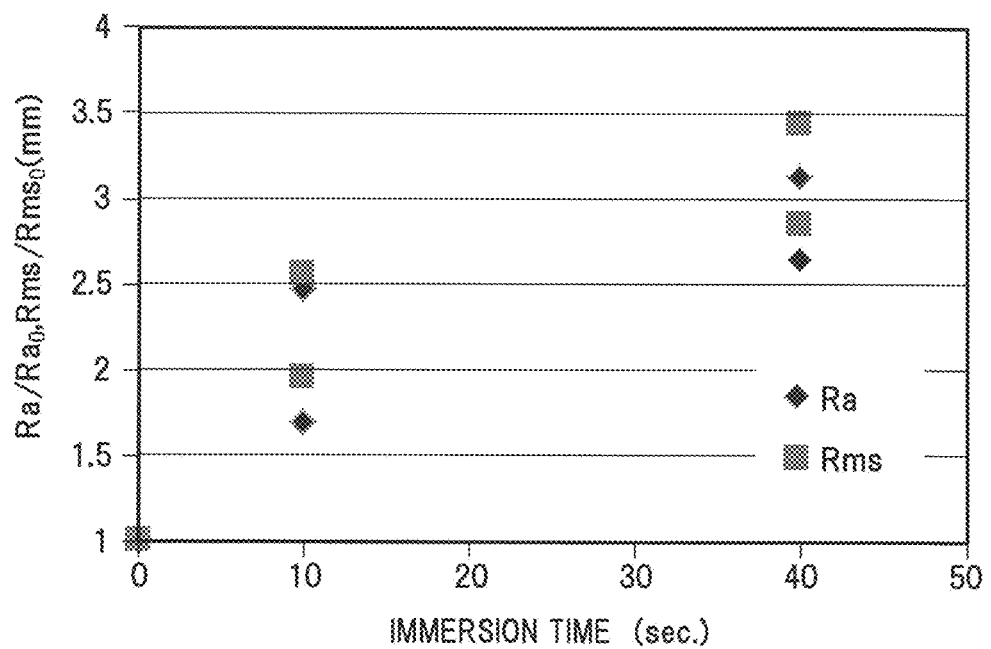
FIG. 6B is a graph showing the relationships between the immersion time and the $Ra/Ra_0$ or the $Rms/Rms_0$ where the $Ra_0$ and the $Rms_0$ were the arithmetic mean roughness Ra before the immersing treatment (when the immersion time=0) and the root mean square roughness Rms before the immersing treatment (when the immersion time=0), respectively.

FIG. 6B is a graph showing the relationships between the immersion time and the $Ra/Ra_0$ or the $Rms/Rms_0$ where the $Ra_0$ and the $Rms_0$ were the arithmetic mean roughness Ra before the immersing treatment (when the immersion time=0) and the root mean square roughness Rms before the immersing treatment (when the immersion time=0), respectively.

According to FIG. 6B, by performing the immersing treatment for 10 seconds, the arithmetic mean roughness Ra of the electrical insulating body 21 of the tube 2 was increased up to 1.70 times or higher before the immersing treatment, and the root mean square roughness Rms of the electrical insulating body 21 of the tube 2 was increased up to 1.96 times or higher before the immersing treatment. Further, by performing the immersing treatment for 40 seconds, the arithmetic mean roughness Ra of the electrical insulating body 21 of the tube 2 was increased up to about 2.65 times or higher before the immersing treatment, and the root mean square roughness Rms of the electrical insulating body 21 of the tube 2 was increased up to 2.85 times or higher before the immersing treatment.

Figure 7A:
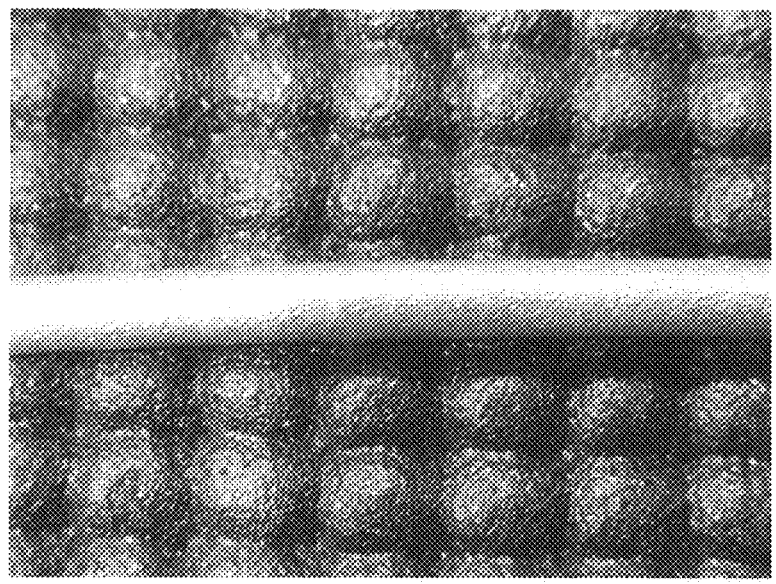
FIGS. 7A and 7B are photographs showing an appearance of the tube with a plating layer formed on an electrical insulating body thereof subjected to the immersing treatment in the sodium naphthalene complex solution.
Figure 7B:
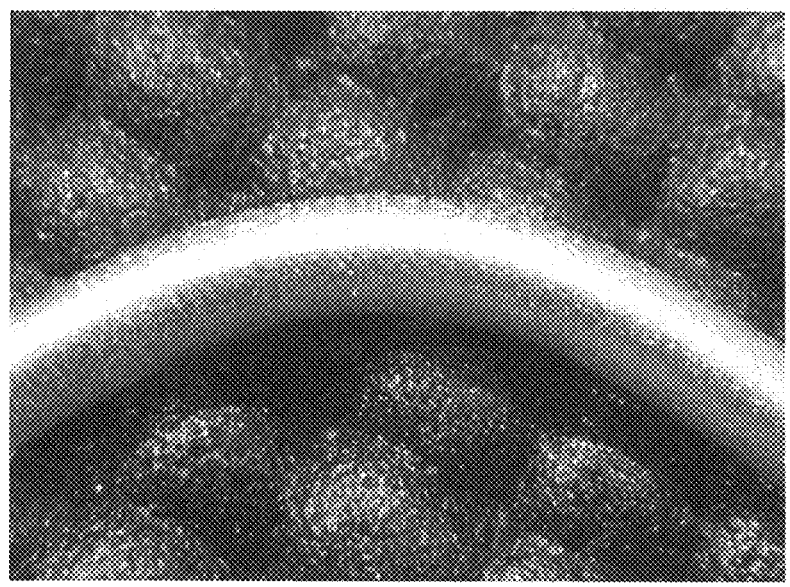

FIG. 7A and FIG. 7B are photographs showing an appearance of the tube 2 with the plating layer 22 which was formed by the method according to the embodiment described above on the electrical insulating body 21 thereof subjected to the immersing treatment in a sodium naphthalene complex solution at room temperature of about 20 to 30 degrees C. for about 10 seconds, a subsequent swing cleaning with acetone for about 30 seconds, and to a further cleaning with running water for 1 minute. According to FIG. 7A and FIG. 7B, it was able to be confirmed that the plating layer 22 was homogeneously formed on the entire surface of the electrical insulating body 21, and that no peeling or the like of the plating layer 22 occurred even in a bent state. From this, it was seen that the strength of the adhesion between the plating layer 22 and the electrical insulating body 21 was high.

Further, for the tube 2 with the above-described electrical insulating body 21 thereof subjected to the immersing treatment in the sodium naphthalene complex solution, the relationships between the arithmetic mean roughness Ra or the root mean square roughness Rms, and the strength of the adhesion between the plating layer 22 and the electrical insulating body 21 were investigated, and as a result, it was confirmed that the strength of the adhesion between the plating layer 22 and the electrical insulating body 21 was especially high when the state of the surface of the electrical insulating body 21 met at least either one of the following two conditions: that the surface of the electrical insulating body 21 was not lower than 40 nm in the arithmetic mean roughness Ra; and that the surface of the electrical insulating body 21 was not lower than 80 nm in the root mean square roughness Rms.

In addition, it was confirmed that the strength of the adhesion between the plating layer 22 and the electrical insulating body 21 was greatly enhanced by the roughening treatment when the state of the surface of the electrical insulating body 21 met at least either one of the following two conditions: that the arithmetic mean roughness Ra of the surface of the electrical insulating body 21 was increased by the roughening treatment up to 1.7 times or higher than before the roughening treatment; and that the root mean square roughness Rms of the surface of the electrical insulating body 21 was increased by the roughening treatment up to 2 times or higher than before the roughening treatment.

EXAMPLE 2

For the electrical insulating body 21 which was subjected to the immersing treatment in a sodium naphthalene complex solution at room temperature of about 20 to 30 degrees C. for about 10 seconds, a subsequent swing cleaning with acetone for about 30 seconds, and to a further cleaning with running water for 1 minute, infrared total internal reflection absorption spectra were measured. As a material for the electrical insulating body 21, a polytetrafluoroethylene (PTFE) which was a fluoropolymer resin was used.

Figure 8A:
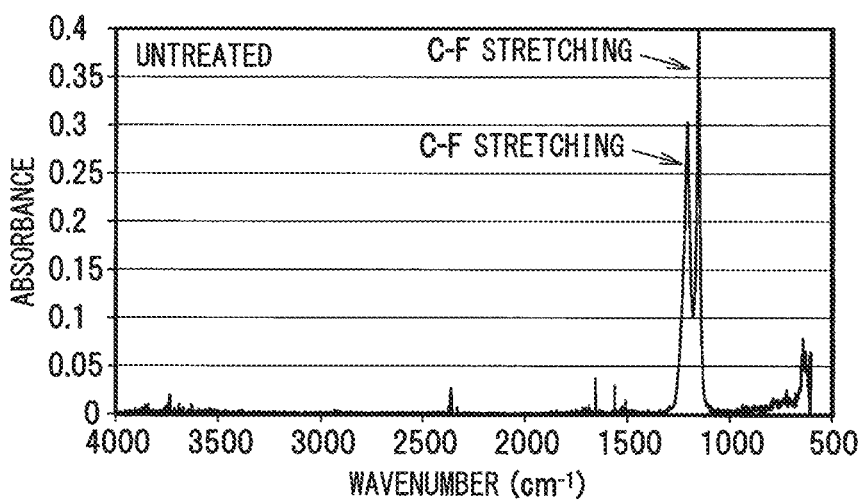
FIGS. 8A, 8B and 8C are graphs showing the infrared total internal reflection absorption spectra of the electrical insulating body before the immersing treatment (when the immersion time=0), after the immersing treatment for 10 seconds, and after the immersing treatment for 40 seconds, respectively.
Figure 8B:
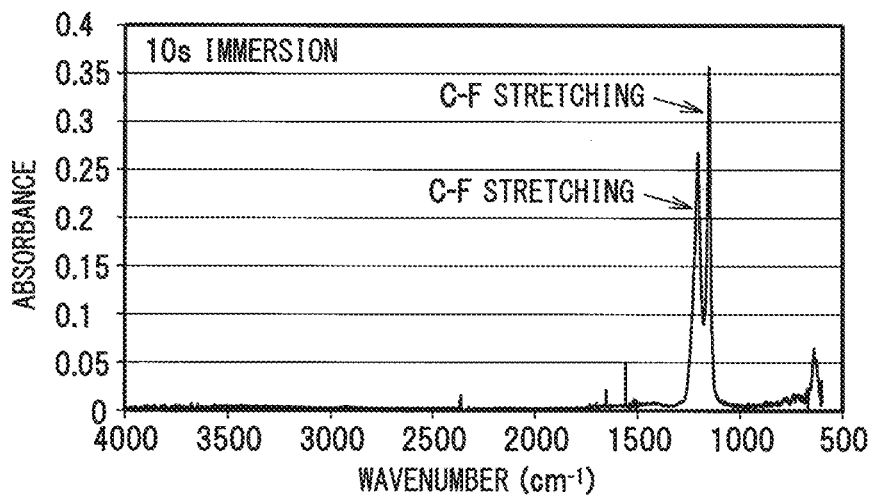
Figure 8C:
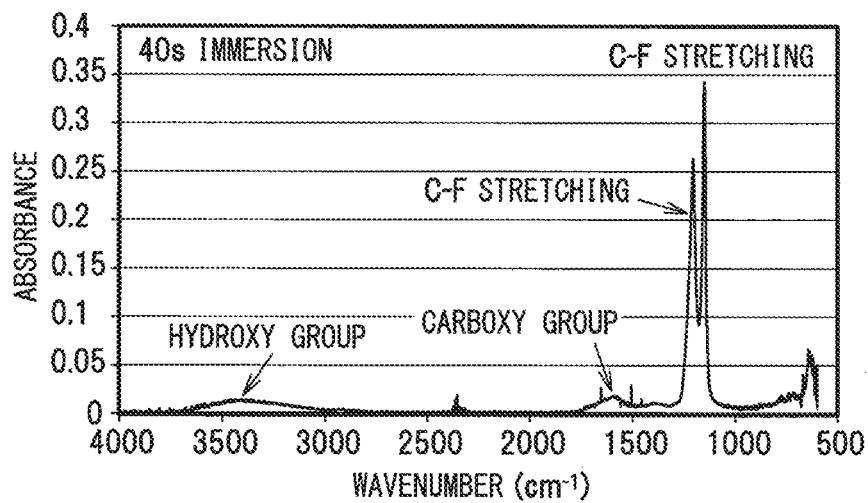
Figure 9A:
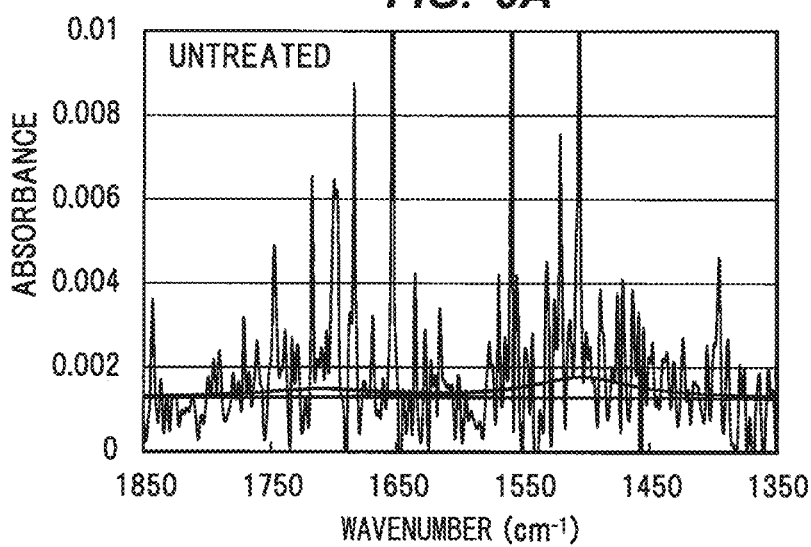
FIGS. 9A, 9B and 9C are enlarged graphs showing regions including absorption peaks ascribed to a carboxy group, in the infrared total internal reflection absorption spectra of FIGS. 8A, 8B and 8C, respectively.
Figure 9B:
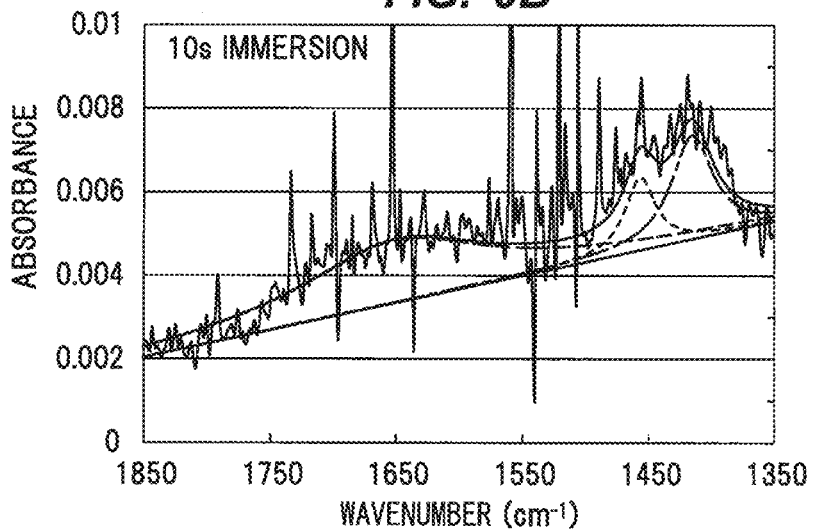
Figure 9C:
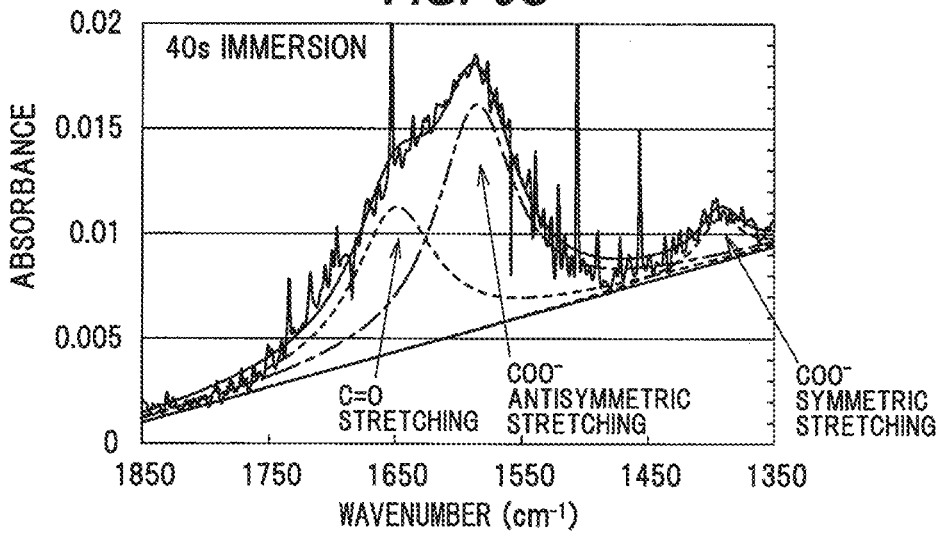
Figure 10A:
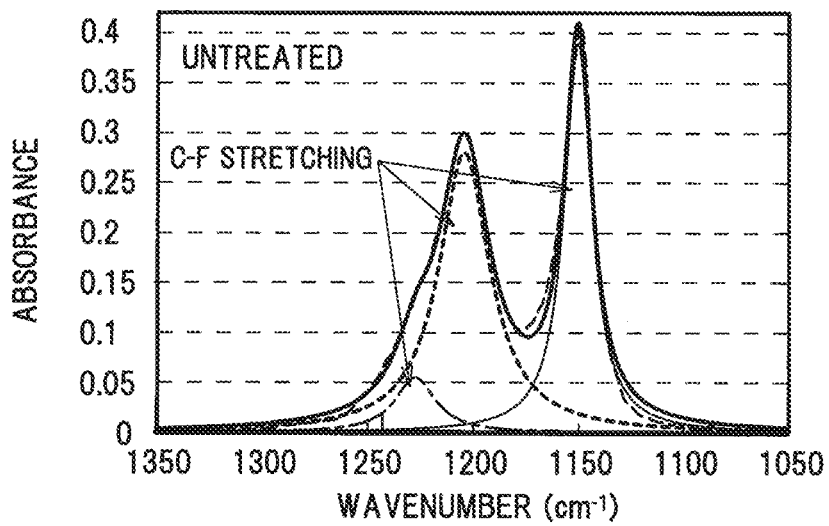
FIGS. 10A, 10B, and 10C are enlarged graphs showing regions including absorption peaks ascribed to a C-F stretching vibration of the fluoropolymer resin, in the infrared total internal reflection absorption spectra of FIGS. 8A, 8B, and 8C, respectively.
Figure 10B:
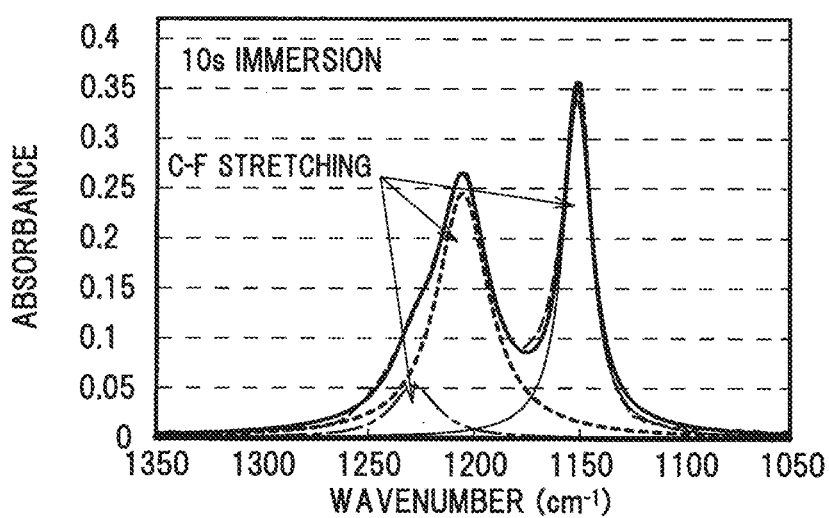
Figure 10C:
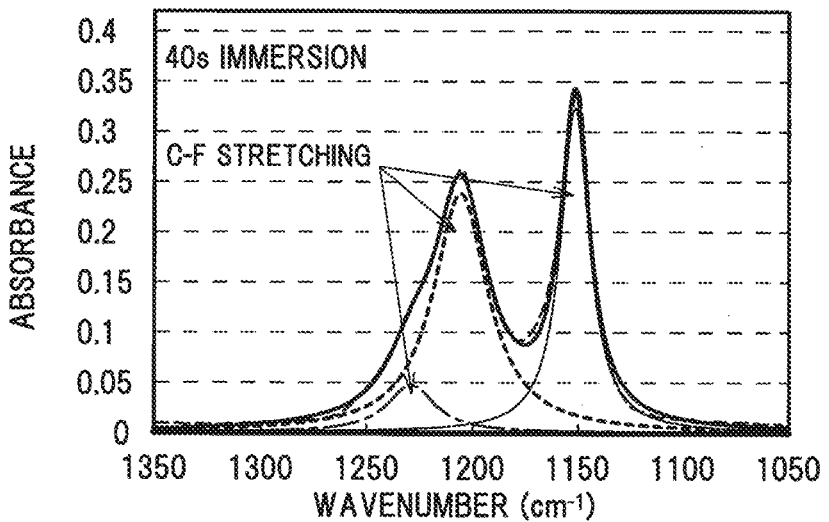

FIG. 8A, FIG. 8B, and FIG. 8C are graphs showing the infrared total internal reflection absorption spectra of the electrical insulating body 21 before the immersing treatment (when the immersion time=0), after the immersing treatment for 10 seconds, and after the immersing treatment for 40 seconds, respectively. Further, FIG. 9A, FIG. 9B, and FIG. 9C are enlarged graphs showing regions including absorption peaks ascribed to a carboxy group, in the infrared total internal reflection absorption spectra of FIG. 8A, FIG. 8B, and FIG. 8C, respectively. FIG. 10A, FIG. 10B, and FIG. 10C are enlarged graphs showing regions including absorption peaks ascribed to a C—F stretching vibration of the fluoropolymer resin, in the infrared total internal reflection absorption spectra of FIG. 8A, FIG. 8B, and FIG. 8C, respectively.

According to FIG. 9A, FIG. 9B and FIG. 9C, it was seen that the intensities of the absorption peaks, which were ascribed to the carboxy group, became high with increase in the immersion time. The values of the integrals of the absorption peaks ascribed to the carboxy group before the immersing treatment, after the immersing treatment for 10 seconds, and after the immersing treatment for 40 seconds, were about 0.09, about 0.54, and about 2.01, respectively.

According to FIG. 10A, FIG. 10B, and FIG. 10C, the absorption peaks, which were ascribed to three C-F stretching vibrations of the fluoropolymer resin, were able to be observed. In FIG. 10A, FIG. 10B, and FIG. 10C, the measured infrared total internal reflection absorption spectra were indicated by dotted lines, and a fitting profile obtained by fitting was substantially coincident therewith, and was the one obtained by synthesizing the absorption peaks ascribed to the three C-F stretching vibrations of the fluoropolymer resin. The values of the integrals of the absorption peaks ascribed to the C—F stretching vibration of the fluoropolymer resin before the immersing treatment, after the immersing treatment for 10 seconds, and after the immersing treatment for 40 seconds, were about 23.40, about 21.0, and about 21.01, respectively.

In the above-mentioned infrared total internal reflection absorption spectra, the value obtained by normalizing the value of the integral of the absorption peak, which was ascribed to the carboxy group, by the value of the integral of the absorption peak, which was ascribed to the C-F stretching vibration of the fluoropolymer resin, that is, the value obtained by dividing the value of the integral of the absorption peak, which was ascribed to the carboxy group, by the value of the integral of the absorption peak, which was ascribed to the C-F stretching vibration of the fluoropolymer resin, was about 0.0038 before the immersing treatment, about 0.026 after the immersing treatment for 10 seconds, and about 0.096 after the immersing treatment for 40 seconds.

As a result of investigating the relationships between the profiles of the infrared total internal reflection absorption spectra and the strength of the adhesion between the plating layer 22 and the electrical insulating body 21, it was confirmed that the strength of the adhesion between the plating layer 22 and the electrical insulating body 21 was greatly enhanced when the value obtained by normalizing (dividing) the value of the integral of the absorption peak, which was ascribed to the carboxy group, by the value of the integral of the absorption peak, which was ascribed to the C—F stretching vibration of the fluoropolymer resin, was not smaller than 0.02, and that the strength of the adhesion between the plating layer 22 and the electrical insulating body 21 was more greatly enhanced when the value obtained by normalizing (dividing) the value of the integral of the absorption peak, which was ascribed to the carboxy group, by the value of the integral of the absorption peak, which was ascribed to the C—F stretching vibration of the fluoropolymer resin, was not smaller than 0.03.

Summary of the Embodiments

Next, the technical ideas grasped from the above-described embodiments will be described with the aid of the reference characters and the like in the embodiments. It should be noted, however, that each of the reference characters and the like in the following descriptions is not to be construed as limiting the constituent elements in the claims to the members and the like specifically shown in the embodiments.

[1] A linear shape member (1) or (2), comprising: a linear shape electrical insulating body (11) or (21) comprising a fluoropolymer resin and including a plurality of crack shape grooves on a surface thereof; and a plating layer (12) or (22) coating the surface of the electrical insulating body (11) or (21), wherein the surface of the electrical insulating body (11) or (21) meets at least either one of two conditions: that the surface of the electrical insulating body (11) or (21) is not lower than 40 nm in arithmetic mean roughness Ra; and that the surface of the electrical insulating body (11) or (21) is not lower than 80 nm in root mean square roughness Rms.

[2] A linear shape member (1) or (2) producing method, comprising: performing a roughening treatment on a surface of a linear shape electrical insulating body (11) or (21) comprising a fluoropolymer resin; and after the roughening treatment, performing a plating treatment on the surface of the electrical insulating body (11) or (21) to form a plating layer (12) or (22) thereon, wherein the roughening treatment is an immersing treatment in a sodium naphthalene complex solution, a low temperature blasting treatment, or an electron beam irradiation.

[3] The linear shape member (1) or (2) producing method as specified in [2] above, wherein the roughening treatment is the immersing treatment in the sodium naphthalene complex solution, with the state of the surface of the electrical insulating body (11) or (21), which results from the roughening treatment, meeting at least either one of the following two conditions: that the surface of the electrical insulating body (11) or (21) is not lower than 40 nm in arithmetic mean roughness Ra; and that the surface of the electrical insulating body (11) or (21) is not lower than 80 nm in root mean square roughness Rms.

[4] The linear shape member (1) or (2) producing method as specified in [2] above, wherein the roughening treatment is the low temperature blasting treatment, which is the blasting treatment with the electrical insulating body (11) or (21) being reduced in temperature by using a liquid nitrogen.

[5] The linear shape member (1) or (2) producing method as specified in any one of [2] to [4] above, wherein at least either one of the following two conditions is met: that the arithmetic mean roughness Ra of the surface of the electrical insulating body (11) or (21) is increased by the roughening treatment up to 1.7 times or higher than before the roughening treatment; and that the root mean square roughness Rms of the surface of the electrical insulating body (11) or (21) is increased by the roughening treatment up to 2 times or higher than before the roughening treatment.

[6] A linear shape member (1) or (2) producing method, comprising: performing a hydrophilizing treatment on a surface of a linear shape electrical insulating body (11) or (21) comprising a fluoropolymer resin; and after the hydrophilizing treatment, performing a plating treatment on the surface of the electrical insulating body (11) or (21) to form a plating layer (12) or (22) thereon, wherein, in an infrared total internal reflection absorption spectrum in the surface of the electrical insulating body (11) or (21) after the hydrophilizing treatment, a value obtained by normalizing (dividing) a value of an integral of an absorption peak, which is ascribed to a carboxy group, by a value of an integral of an absorption peak, which is ascribed to a C-F stretching vibration of the fluoropolymer resin, is not smaller than 0.02.

[7] The linear shape member (1) or (2) producing method as specified in [6] above, wherein the hydrophilizing treatment is an immersing treatment in a sodium naphthalene complex solution.

[8] The linear shape member (1) or (2) producing method as specified in [6] or [7] above, wherein the carboxy group in the surface of the electrical insulating body (11) or (21) is increased in amount by the hydrophilizing treatment up to 6 times or larger than before the hydrophilizing treatment.

[9] A linear shape member (1) or (2), comprising: a linear shape electrical insulating body (11) or (21) comprising a fluoropolymer resin; and a plating layer (12) or (22) coating a surface of the electrical insulating body (11) or (21), with a hydroxy group being present in the surface of the electrical insulating body (11) or (21).

[10] The linear shape member (1) or (2) as specified in [9] above, wherein, in an infrared total internal reflection absorption spectrum in the surface of the electrical insulating body (11) or (21), a value obtained by normalizing (dividing) a value of an integral of an absorption peak, which is ascribed to a carboxy group, by a value of an integral of an absorption peak, which is ascribed to a C—F stretching vibration of the fluoropolymer resin, is not smaller than 0.02.

Although the embodiments of the present invention and the examples have been described above, the present invention is not limited to the embodiments and the examples described above, but various modifications can be made without departing from the spirit of the invention.

Further, the embodiments and the examples described above are not to be construed as limiting the inventions according to the claims. In addition, it should be noted that not all the combinations of the features described in the embodiments and the examples are essential to the means for solving the problems of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A linear shape member producing method, comprising:
    performing a roughening treatment on a surface of a linear shape electrical insulating body comprising a fluoropolymer resin; and
    after the roughening treatment, performing a plating treatment on the surface of the electrical insulating body to form a plating layer thereon,
    wherein the roughening treatment is an immersing treatment in a sodium naphthalene complex solution, a low temperature blasting treatment, or an electron beam irradiation, and
    wherein at least either one of the following two conditions is met: that the arithmetic mean roughness Ra of the surface of the electrical insulating body is increased by the roughening treatment up to 1.7 times or higher than before the roughening treatment; and that the root mean square roughness Rms of the surface of the electrical insulating body is increased by the roughening treatment up to 2 times or higher than before the roughening treatment.

2. The linear shape member producing method according to claim 1, wherein the roughening treatment is the immersing treatment in the sodium naphthalene complex solution, with the state of the surface of the electrical insulating body, which results from the roughening treatment, meeting at least either one of the following two conditions: that the surface of the electrical insulating body is not lower than 40 nm in arithmetic mean roughness Ra; and that the surface of the electrical insulating body is not lower than 80 nm in root mean square roughness Rms.

3. The linear shape member producing method according to claim 1, wherein the roughening treatment is the low temperature blasting treatment, which is the blasting treatment with the electrical insulating body being reduced in temperature by using a liquid nitrogen.

4. A linear shape member producing method, comprising:
    performing a hydrophilizing treatment on a surface of a linear shape electrical insulating body comprising a fluoropolymer resin; and
    after the hydrophilizing treatment, performing a plating treatment on the surface of the electrical insulating body to form a plating layer thereon,
    wherein, in an infrared total internal reflection absorption spectrum in the surface of the electrical insulating body after the hydrophilizing treatment, a value obtained by normalizing (dividing) a value of an integral of an absorption peak, which is ascribed to a carboxy group, by a value of an integral of an absorption peak, which is ascribed to a C-F stretching vibration of the fluoropolymer resin, is not smaller than 0.02.

5. The linear shape member producing method according to claim 4, wherein the hydrophilizing treatment is an immersing treatment in a sodium naphthalene complex solution.

6. The linear shape member producing method according to claim 4, wherein the carboxy group in the surface of the electrical insulating body is increased in amount by the hydrophilizing treatment up to 6 times or larger than before the hydrophilizing treatment.

7. A linear shape member, comprising:
    a linear shape electrical insulating body comprising a fluoropolymer resin; and a plating layer coating a surface of the electrical insulating body, with a hydroxy group being present in the surface of the electrical insulating body, wherein, in an infrared total internal reflection absorption spectrum in the surface of the electrical insulating body, a value obtained by normalizing (dividing) a value of an integral of an absorption peak, which is ascribed to a carboxy group, by a value of an integral of an absorption peak, which is ascribed to a C-F stretching vibration of the fluoropolymer resin, is not smaller than 0.02.

* * * * *